United States Patent [19]

Bevacqua

[11] 4,184,379

[45] Jan. 22, 1980

[54] TUNING APPARATUS

[75] Inventor: Louis A. Bevacqua, Des Plaines, Ill.

[73] Assignee: Motorola, Inc., Schaumburg, Ill.

[21] Appl. No.: 904,827

[22] Filed: May 11, 1978

[51] Int. Cl.² ............................ H03J 1/06; H03J 1/08; G05G 1/02

[52] U.S. Cl. ..................................... 74/10.33; 74/409; 334/7

[58] Field of Search .................... 74/10.33, 409; 334/7

[56] References Cited

U.S. PATENT DOCUMENTS

| | | | |
|---|---|---|---|
| 2,162,282 | 6/1939 | Leishman | 74/409 X |
| 3,174,356 | 3/1965 | Michalec | 74/409 X |
| 3,365,973 | 1/1968 | Henden | 74/409 |
| 3,727,156 | 4/1973 | Olah | 334/7 |
| 3,906,806 | 9/1975 | Harlan | 74/10.33 |
| 3,946,344 | 3/1976 | Wilkinson | 334/7 |

Primary Examiner—Allan D. Herrmann
Attorney, Agent, or Firm—Melvin A. Klein; James W. Gillman

[57] ABSTRACT

An improved tuning apparatus with manual and pushbutton tuning with compact low profile design. For pushbutton tuning operation gear segment members loaded with a spring bias are arranged for engagement with each of the pushbutton devices to eliminate any lost motion being imparted to the core slide bar. Motion imparted to the slide bar actuates the cores and associated coils to change frequency. A declutching mechanism is used when using the pushbutton operation to remove the core slide bar from engagement with a manual drive input.

5 Claims, 2 Drawing Figures

TUNING APPARATUS

This invention relates to an improved compact low profile tuning apparatus with manual and pushbutton tuning as for example as are used for car radio receivers.

BACKGROUND OF THE INVENTION

In the prior art it is well known to use manual and pushbutton tuning in radio receivers and the use of a clutch mechanism for decoupling the manual tuning during pushbutton operation is described, for example, in U.S. Pat. No. 3,906,806 to Harlan. Furthermore, the use of a "memory" cams associated with each of the pushbuttons for selecting a desired frequency is described in U.S. Pat. No. 3,727,156 to Olah.

A problem associated with the operation of these types of tuning devices is that the mechanisms are complex in that they require many moving parts causing lost motion which has resulted in a decrease in the quality listening entertainment on a receiver. Furthermore, because of the complex mechanisms it is a problem to build a small compact unit with a low profile to provide the necessary functions of operation desired in a car radio receiver. An attempt at eliminating lost motion within a flat pack tuning device is the tuning device described in Wilkinson U.S. Pat. No. 3,946,344. However, this tuning device has a plurality of pin members which must be positioned in V-shaped apertures formed in an elongated slide bar and, therefore, misalignment of the pins and slide bar apertures causes a lost motion resulting in fluttering in the tuning device.

SUMMARY OF THE INVENTION

Therefore it is a principle object of the present invention to improve pushbutton tuning apparatus.

It is a further object of the present invention to eliminate lost motion in pushbutton tuning apparatus.

It is a further object of the present invention to construct a compact low profile tuning apparatus of simplified design construction.

It is still a further object of the present invention to provide greater flexibility inside the housing of a tuning apparatus to enable pushbutton and manual drive functions in a simplified manner.

The invention generally speaking is accomplished by the use of balanced multiple gear segments which are engaged by the pushbutton assemblies to impart movement to the core slide bar without lost motion.

BRIEF DESCRIPTION OF THE DRAWINGS

The objects above as well as other advantages will be more readily understood after reading of the following description which should be read in reference to the accompanying drawing in which.

DETAILED DESCRIPTION OF THE PREFERRED EMBODIMENT OF THE INVENTION

Figure 1:
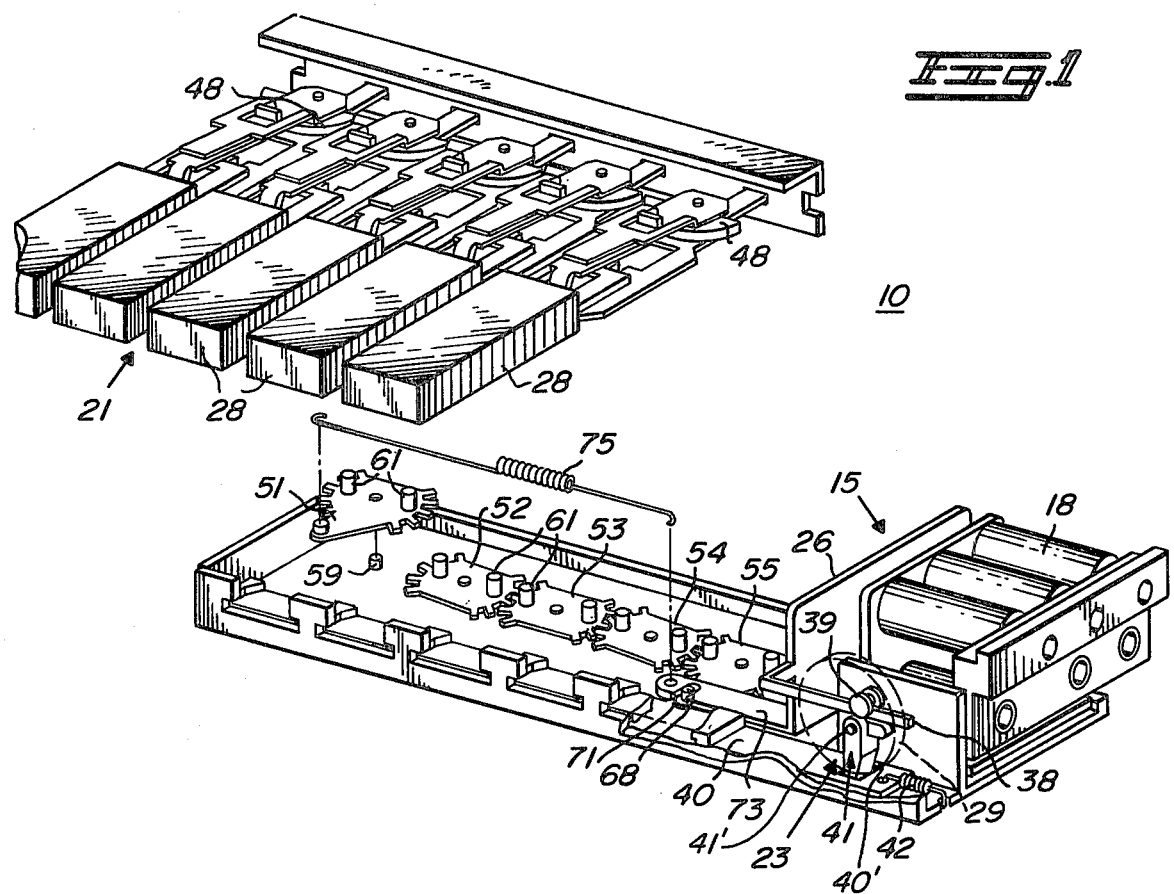
FIG. 1 is a perspective view of the improved tuning apparatus according to the present invention.
Figure 2:
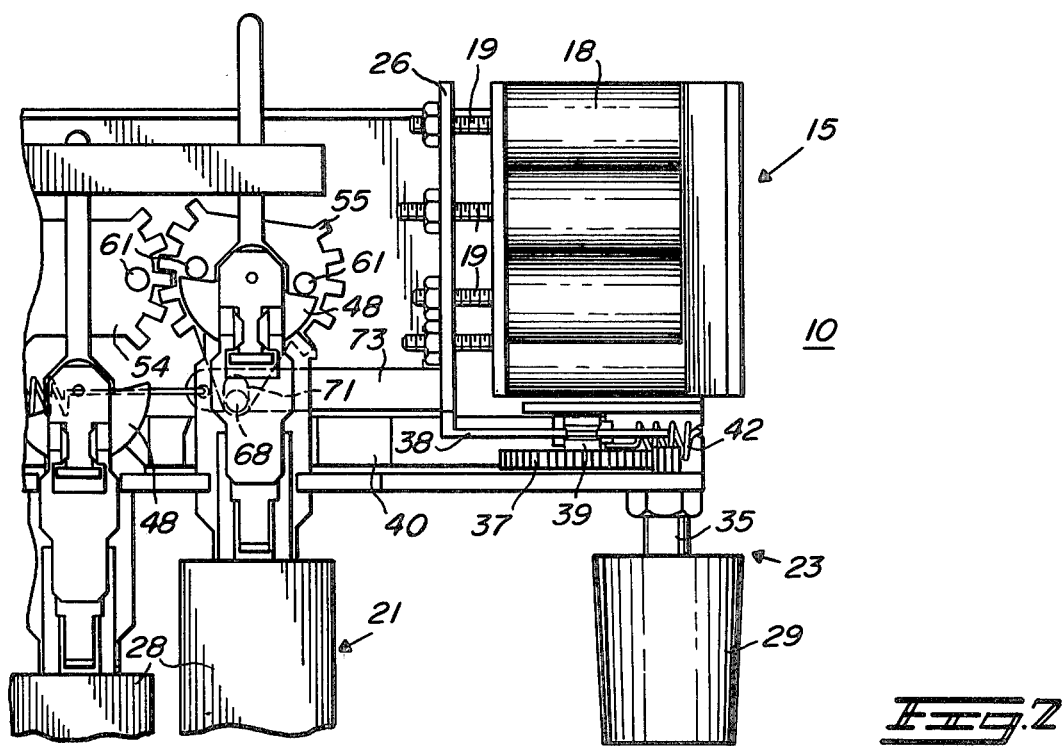
FIG. 2 is a partial plan view of the improved tuning apparatus of the invention illustrating certain details thereof.

As shown in FIGS. 1 and 2 a flat pack tuning apparatus 10 according to the invention comprises the perm tune assembly 15 which houses AM and FM coils 18 and cores 19, pushbutton assembly section 21 and manual tuning mechanism 23. In selecting the broadcast frequency desired the cores 19 are moved relative to the coils 18 by the actuation of a core slide bar 26. Actuation of the core slide bar 26 is accomplished by either pushing one of the pushbutton assemblies 28 of section 21 or by turning knob 29 of a manual tuning mechanism 23.

Manual drive mechanism 23 includes a manual drive shaft 35 which rotates a drive gear 37 which in turn engages a drive rod 38 connected to slide bar 26 through a V-shaped clutch member 39. For pushbutton operation manual drive is de-clutched through the action of pushbutton assemblies 28 which cause a clutch bar 40 to be moved in a transverse direction. Clutch bar 40 is formed with an opening 40' through which is received a link member 41 which is pivotally mounted on a pin 41' so as to function as a bellcrank. By this structure pressure is removed from the drive rod 38 which then is disengaged from the clutch member 39 through which friction drive occurs. A spring 42 maintains clutch bar 40 in its normal operative position for manual operation. It will be understood that a second slide bar (not shown) is actuated by pushbutton assemblies 28 to operate an AM-FM band selection.

In accordance with the invention for pushbutton operation each of the pushbutton assemblies 28 has an associated settable memory cam unit 48 for engaging a corresponding gear segment member 51-55. Each of the gear segment members is pivotally mounted on the frame on pins 59 and has a pair of cam follower pins 61 which follow the movement of settable cam units 48. Upon pushing one of the pushbutton assemblies 28, the associated cam unit 48 engages cam follower pins 61 positioned on the corresponding gear segment member. In this manner, a pivot motion is imparted to the gear segment member which meshes with the gear segment members. It will be noted that gear segment member 55 has an extension upon which is positioned a member 68 that is received in a slot 71 formed in extension 73 of core slide bar 26. Thus any pivot movement imparted to any of the gear segment members 51-54 cause a corresponding movement to be imparted to gear segment member 55 which serves as a master gear to cause the movement to be imparted to the core slide bar 26 which is directly connected to the tuning cores 19.

It will be noted that a coil spring 75 connects gear member 51 to the extension 73 of core slide bar 26 and maintains all of the gear segment members 51-55 in balance. By this structure a tension is applied to each of the gear segment members and the core slide bar 26 thereby eliminating any lost motion therebetween.

It will now be appreciated that by virtue of the unique structure of the tuning apparatus of the invention that upon actuation of the pushbutton units that the desired frequency of a broadcast system is selected without lost motion and hence without any problem in frequency shift and attendant loss of listening pleasure. More than this the housing for the pushbutton receiver is compact in design and yet affords the expedient of manual tuning with appropriate declutching of manual control during pushbutton operation.

While a particular embodiment of the invention has been shown and described, it should be understood that the invention is not limited thereto since may modifications may be made. It is therefore contemplated to cover by the present application any and all such modifications as fall within the true spirit and scope of the appended claims.

What is claimed is:

1. A compact low profile pushbutton tuning apparatus comprising:
a frame,
tuning means supported by said frame tunable to positions representative of desired frequencies,
pushbutton assemblies each including a settable cam mounted on said frame for actuation of said tuning means to a desired frequency,
gear segment members pivotally supported on said frame arranged for an engagement with each of said settable cam upon actuation of the corresponding pushbutton assembly,
each of said gear segment members being arranged in a gear train whereby pivoting movement of one is imparted to all of them,
slide bar means positioned at one end of said gear train being connected to one of said gear segment members and drivingly connected to said tuning means,
said bar means and gear segment members being maintained in a balanced condition until such time as a one of said pushbutton assemblies is actuated to cause engagement of its associated cam with a one of said gear segment members to move said tuning means to a predetermined position without any lost motion thereto.

2. Apparatus according to claim 1 including spring means connected to said slide bar means and one of said gear segment members to apply tension thereto.

3. Apparatus according to claim 1 wherein said slide bar means includes a bar member having a notch formed therein to receive a member extending from one of said gear segment members.

4. Apparatus according to claim 1 including manual tuning means which includes clutch means that disengages during pushbutton operation.

5. Apparatus according to claim 4 wherein said clutch means includes a clutch bar which moves transversely to release a manual drive mechanism from engagement with said slide bar means upon actuation of a one of said pushbutton assemblies.

* * * * *